United States Patent
Stanard

(10) Patent No.: US 7,257,857 B2
(45) Date of Patent: Aug. 21, 2007

(54) APPARATUS AND METHOD FOR CIRCUIT BOARD ROUTING FIXTURE

(75) Inventor: Michael Steven Stanard, Oak Park, IL (US)

(73) Assignee: Tyco Electronics Corporation, Middletown, PA (US)

( * ) Notice: Subject to any disclaimer, the term of this patent is extended or adjusted under 35 U.S.C. 154(b) by 492 days.

(21) Appl. No.: 10/348,873

(22) Filed: Jan. 22, 2003

(65) Prior Publication Data

US 2004/0142510 A1   Jul. 22, 2004

(51) Int. Cl.
*A47L 5/38*   (2006.01)
(52) U.S. Cl. .......................................... 15/310; 15/301
(58) Field of Classification Search .................. 15/301, 15/303, 310; 248/694, 346.01, 678
See application file for complete search history.

(56) References Cited

U.S. PATENT DOCUMENTS

| | | | | | |
|---|---|---|---|---|---|
| 1,700,264 | A | * | 1/1929 | Kehoe | 15/301 |
| 1,963,242 | A | * | 6/1934 | Nelson | 248/346.01 |
| 3,165,773 | A | * | 1/1965 | Palpacelli | 15/310 |
| 4,777,021 | A | * | 10/1988 | Wertz et al. | 422/101 |
| 4,927,604 | A | * | 5/1990 | Mathus et al. | 422/101 |
| 5,473,258 | A | * | 12/1995 | Abe | 324/754 |
| 6,532,618 | B2 | * | 3/2003 | Koch | 15/310 |
| 6,671,940 | B2 | * | 1/2004 | Ishii | 29/743 |
| 6,902,702 | B1 | * | 6/2005 | Winegarden et al. | 422/100 |

* cited by examiner

*Primary Examiner*—Theresa T. Snider

(57) ABSTRACT

An apparatus for retaining and cleaning a circuit board array, which comprise a fixture having a generally elongated connecting surface and one or more terminating open ends, which may optionally integrate a hollow element, creating an aperture in the fixture adjacent to a tab on the circuit board array, wherein the terminating open ends extend toward a machine component having at least one cavity extending through the topside of the machine component, and a vacuum system connected to the cavity, wherein the vacuum system applies suction through the cavity and the terminating open ends.

30 Claims, 11 Drawing Sheets

APPARATUS AND METHOD FOR CIRCUIT BOARD ROUTING FIXTURE

FIELD OF THE INVENTION

This invention relates to circuit board routing fixtures. More particularly, this invention relates to vacuum systems to remove dust from a circuit board.

BACKGROUND OF THE INVENTION

The manufacture of circuit boards involves the production of a multitude of circuit boards manufactured from a single array, referred to as a circuit board array. The circuit board arrays are manufactured, tooled, and populated with electronic devices, and then cleaved into individual circuit boards so that the individual circuit boards can be assembled into a desired application. The process of removing individual circuit boards from a circuit board array is commonly referred to as de-paneling. One of the methods of de-paneling boards is routing. Circuit board routing is the process by which a number of tabs on a circuit board array are cleaved in order to singulate one circuit board from another circuit board and/or from the excess material (scrap) that may be adjacent to the circuit board. The tabs on the connected circuit board array are routed by a rotating mechanism containing an appropriate bit. The bit is positioned in an opening at the perimeter of the circuit board adjacent to the tab to be routed. The bit moves through the tab and grinds out the tab creating dust and debris, which must be removed.

Circuit board routing uses a fixture to locate and hold the circuit board while the circuit board is being routed. The fixture keeps the circuit board from moving during the routing process. As a circuit board is routed, a vacuum system is used to collect dust created during the routing operation. For dust collection to be effective, the suction created by a vacuum system must be concentrated at the area being routed. A vacuum system creates a space where the pressure is below normal atmospheric pressure, and has a practical result of imposing a suction on that space. A vacuum system applied to a small surface area has a greater suction velocity (pull) then when the same vacuum system is applied to a larger surface area. However, concentrating a vacuum system at the point of the routing operation becomes much more difficult when the circuit board is highly populated with electronic devices, such as integrated circuits, capacitors, resistors and other components.

Current vacuum systems apply suction over a broad surface area of the circuit board array and are unable to sufficiently remove the dust that accumulates in the spaces surrounding where the tabs have been routed. The resulting accumulation of dust can have a detrimental impact on the functionality of the electrical devices housed in the circuit board and/or create environmental concerns due to airborne dust.

As a result, it was desirable to provide an improved vacuum system employed to remove dust from circuit boards.

SUMMARY OF THE INVENTION

The present invention discloses an improved vacuum system. In one embodiment, a fixture is integrated with a vacuum system, which concentrates the vacuum system's suction at the underside of the circuit board directly to areas where the tabs are cleaved. The fixture may further comprise hollow elements, which are localized at each tab on the circuit board array that will be routed. An open end on the bottom of the hollow elements extends into a terminating open end of the fixture, which extends into a cavity underneath the fixture, while the other open end at the other end of the hollow element contacts the surface area surrounding the tab that will be cleaved. The vacuum system applies suction to the cavity and up through the hollow elements.

The vacuum system applies suction pressure to the cavity and hollow elements as the tabs on the circuit board array are routed. The hollow elements are substantially perpendicular to the circuit board array, and as a result, each hollow element is aligned substantially perpendicular under each tab to be routed on the circuit board array. These hollow elements, incorporated into the fixture, apply suction on the underside of the routed tabs. Consequently, each circumference or perimeter, which surrounds the individual tabs to be cleaved, ensures that the dust is effectively removed.

BRIEF DESCRIPTION OF THE DRAWINGS

FIG. 10 is a perspective view of a fixture adapter installed on a machine top plate having one large aperture through which the suction of the vacuum system moves through.

DETAILED DESCRIPTION OF THE INVENTION

Figure 1:
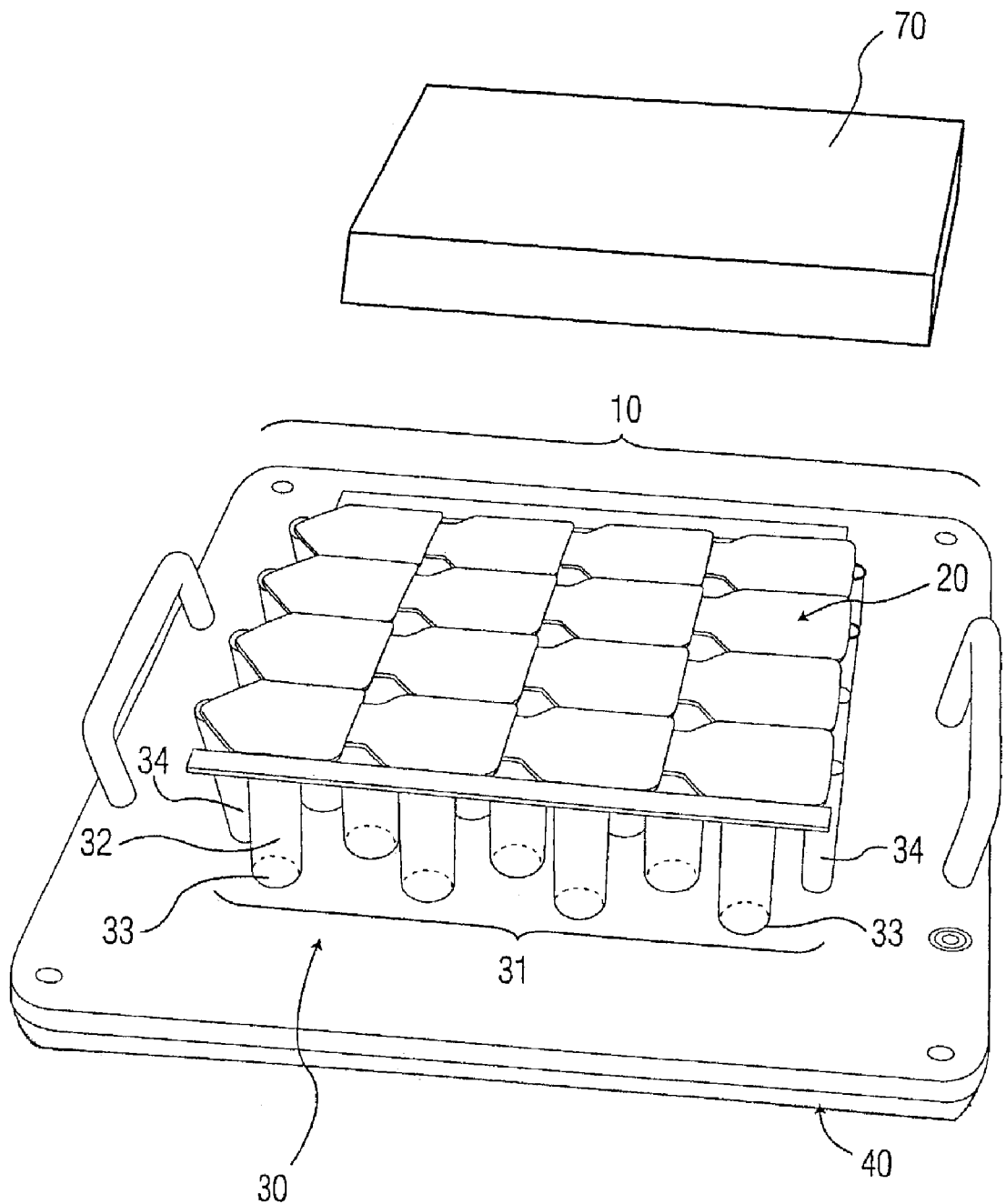
FIG. 1 is a perspective view of an exemplary circuit board array (CBA) comprising sixteen individual circuit boards, with the CBA installed on an embodiment of a fixture, and wherein the fixture is installed on a fixture adapter in accordance with an embodiment of the present invention.

While the present invention is susceptible of embodiment in varied forms, what is shown in the drawings will hereinafter be understood to be a preferred embodiment of the present invention. The present disclosure is to be considered as setting forth an exemplification of the invention, which in no way is intended to limit the invention to the specific embodiment illustrated below. In referring to the drawings, like reference numerals and letters indicate like parts throughout the several drawings.

FIG. 1 shows an exemplary apparatus for circuit board routing 10. In this embodiment, a sixteen CBA 20 is shown installed on a fixture 30, which is a substantially cylindrical element fixture 30 in this embodiment. However, there are a variety of fixtures 30 which can be utilized in the present application. The fixture 30 is installed on a top portion of a fixture adapter 40. Fixture 30 comprises a generally elongated connecting surface 31 and at least one, and preferably, a plurality of supports 32 that are connected to and extend transverse from the connecting surface 31. In this embodiment, the supports 32 (hereinafter referred to as "hollow elements") are substantially cylindrical hollow elements. These hollow elements are positioned substantially perpendicular to the connecting surface 31. The hollow elements 32 are generally elongated with their shape defined by the terminating open end 33 of the connecting surface 31. The terminating open end 33 is a cut-through creating an aperture in the fixture 30. The terminating open end 33 has a defined circumference or perimeter, which allows vacuum suction to be localized to a particular location on the circuit board. The hollow elements 32 can take on a number of shapes, including but not limited to, squares or rectangles, all of which extend transverse from the connecting surface 31

In one embodiment, the hollow elements 32 have a first and second open end 35, whose openings are defined by the perimeter or circumference of the terminating open end 33. In this embodiment, the underside of the CBA 20 rests across the hollow elements 32. In addition, the present embodiment shows, one or more standing pins 34, which are substantially cylindrical, connected to, and extending perpendicularly transverse from the connecting surface 31. In the present embodiment, a routing machine 70, of which any variety known in the art may be used, is utilized to route the CBA 20.

In another exemplary embodiment, drilling directly through the fixture 30 at the tab locations creates the terminating open end, and, no hollow elements 32 are installed on the fixture. This particular embodiment allows the CBA to rest directly on the fixture 30, as vacuum suction is localized directly through the terminating open ends 33.

Figure 2:
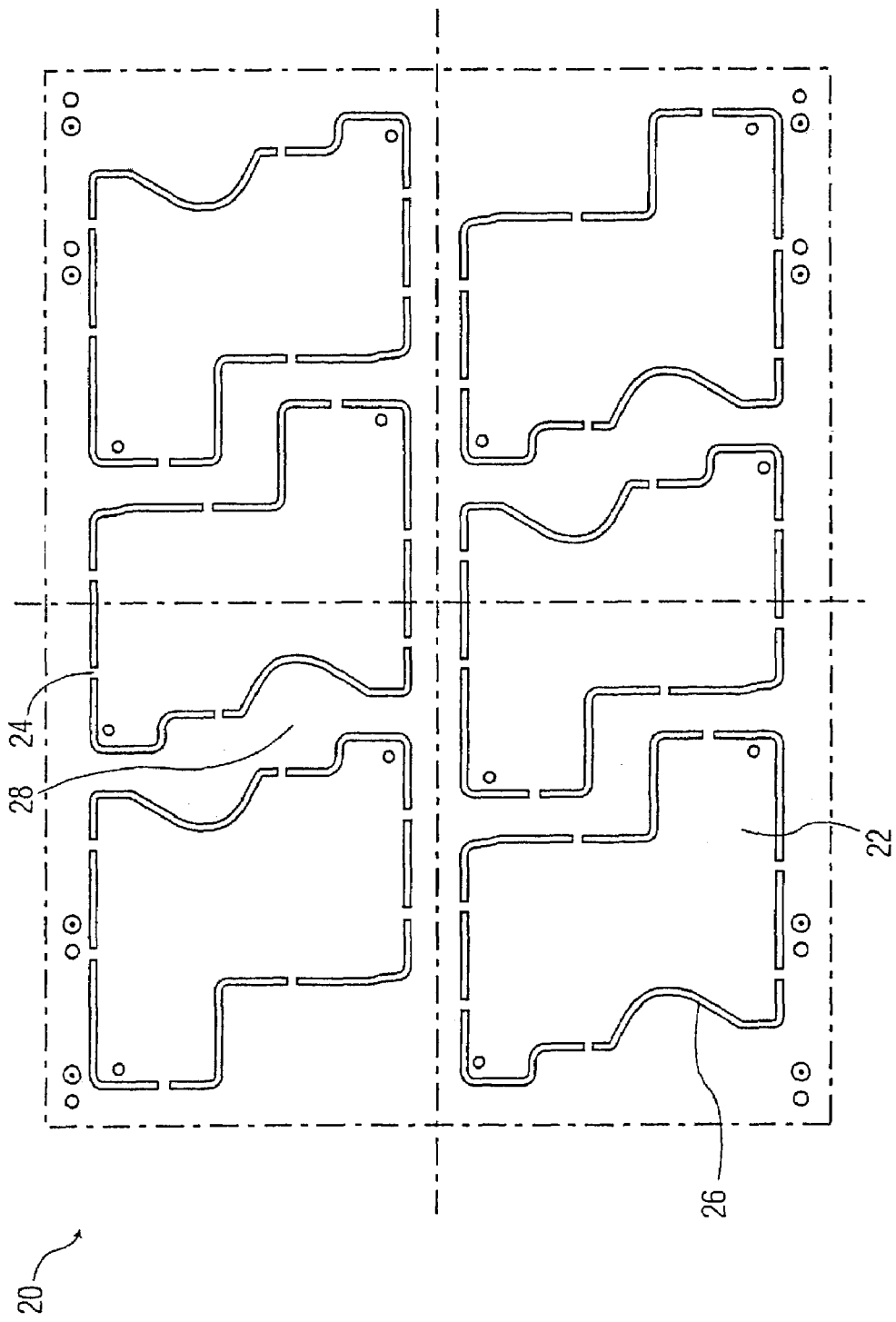
FIG. 2 is a top planar view of an exemplary CBA housing six individual circuit boards.

FIG. 2 shows generally, an overhead view of an exemplary CBA 20, with tabs 24 positioned throughout the CBA 20. The CBA 20 includes etchings 26 for six individual circuit boards 22, and scrap 28 between the six circuit boards 22. The etchings 26 carve through the CBA 20 leaving only the tabs 24 holding the six circuit boards 22 to the scrap 28.

Figure 3:
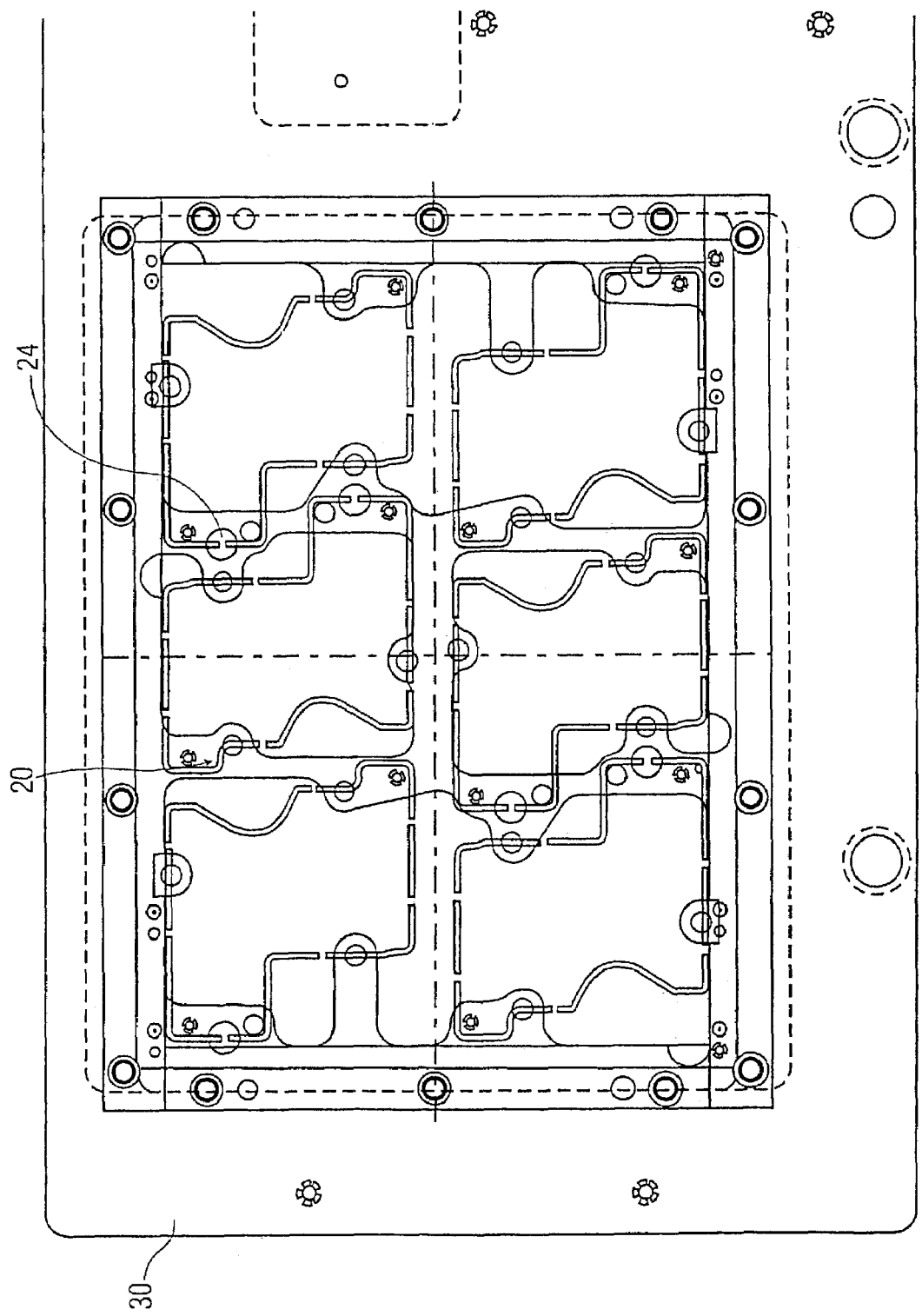
FIG. 3 is a top planar view illustrating the CBA of FIG. 1 mounted on a traditional fixture.

FIG. 3 is an overhead view illustrating, generally, CBA 20 and fixture 30 in accordance with an embodiment of the present invention, and open area under each tab 24.

Figure 4:
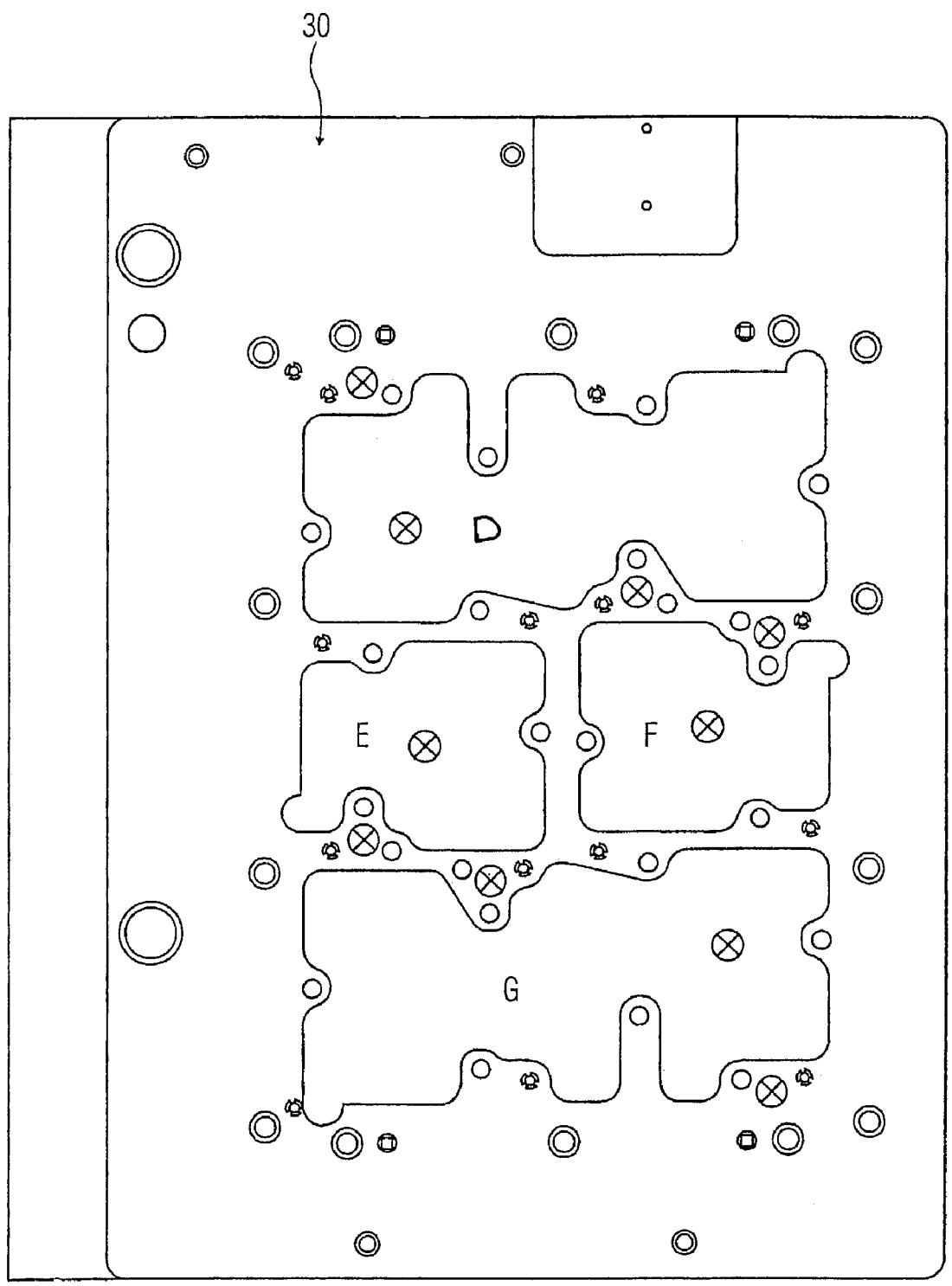
FIG. 4 is a bottom planar view of an exemplary traditional fixture illustrating areas where suction is applied.
Figure 8:
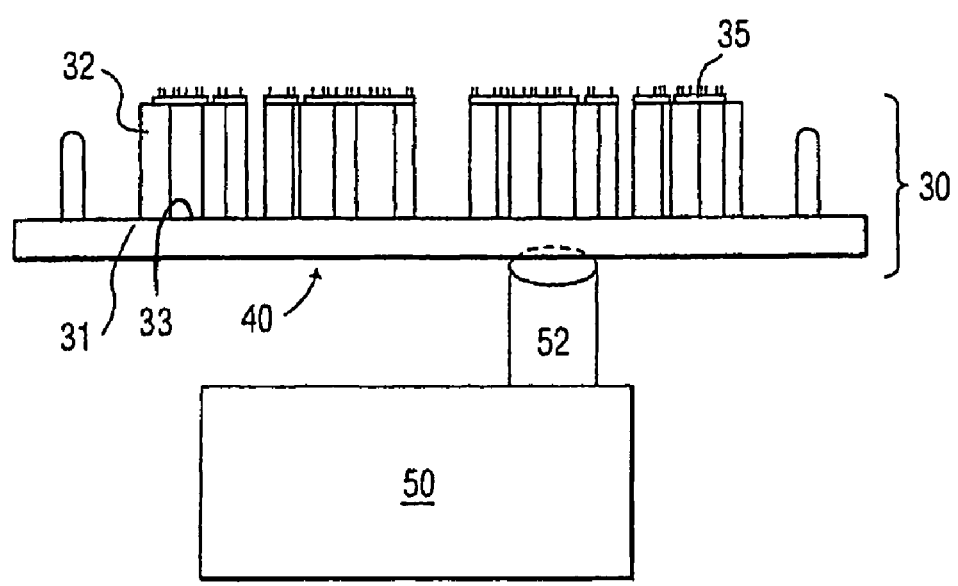
FIG. 8 is a side planar view of a fixture with hollow elements projecting out of the fixture.

FIG. 4 is a bottom view of a fixture 30. FIG. 4 illustrates surface areas D, E, F, and G that are suctioned by a vacuum system 50, which is illustrated in FIG. 8 in accordance with an embodiment of the present invention. In this embodiment, suction is applied generally to the surface areas D, E, F, and G.

Figure 5:
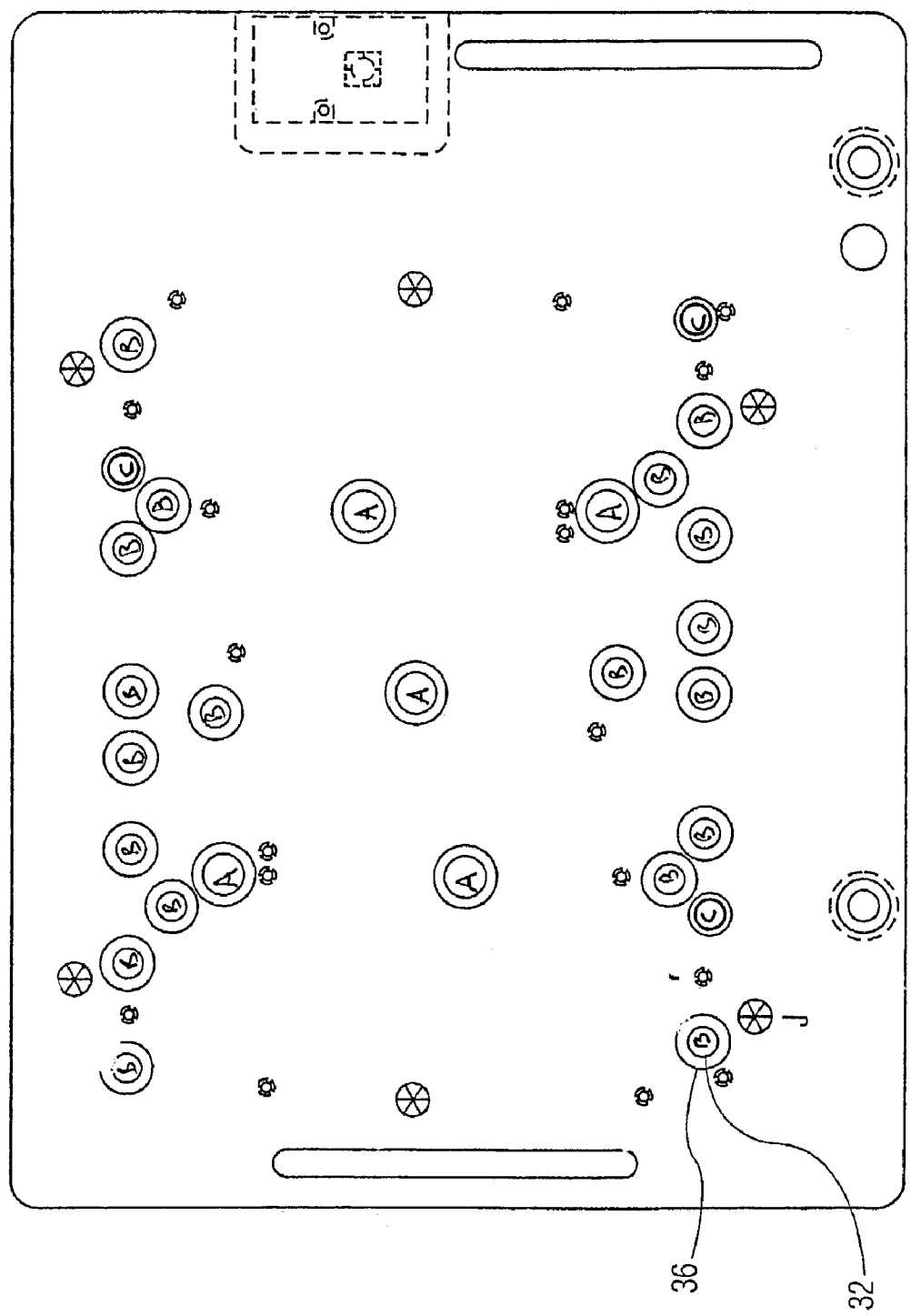
FIG. 5 is a top planar view of a fixture in accordance with an embodiment of the present invention, illustrating the surface areas where suction is applied.

FIG. 5 is an overhead view of surface areas a, b and c suctioned by a preferred embodiment of the vacuum system 50. A hollow element 32 or terminating open end 33 is adjacent to each of surface areas A, B and C. Suction is applied through the hollow element 32 or terminating open end 33 to each of areas A, B and C. The circumference or perimeter 36 of each hollow element 32 or terminating open end 33 is preferably sufficient to surround the length of the tabs 24 of FIG. 2. The surface areas A, B and C correspond to the tabs 24 on the printed CBA 20 shown in FIG. 6.

Figure 6:
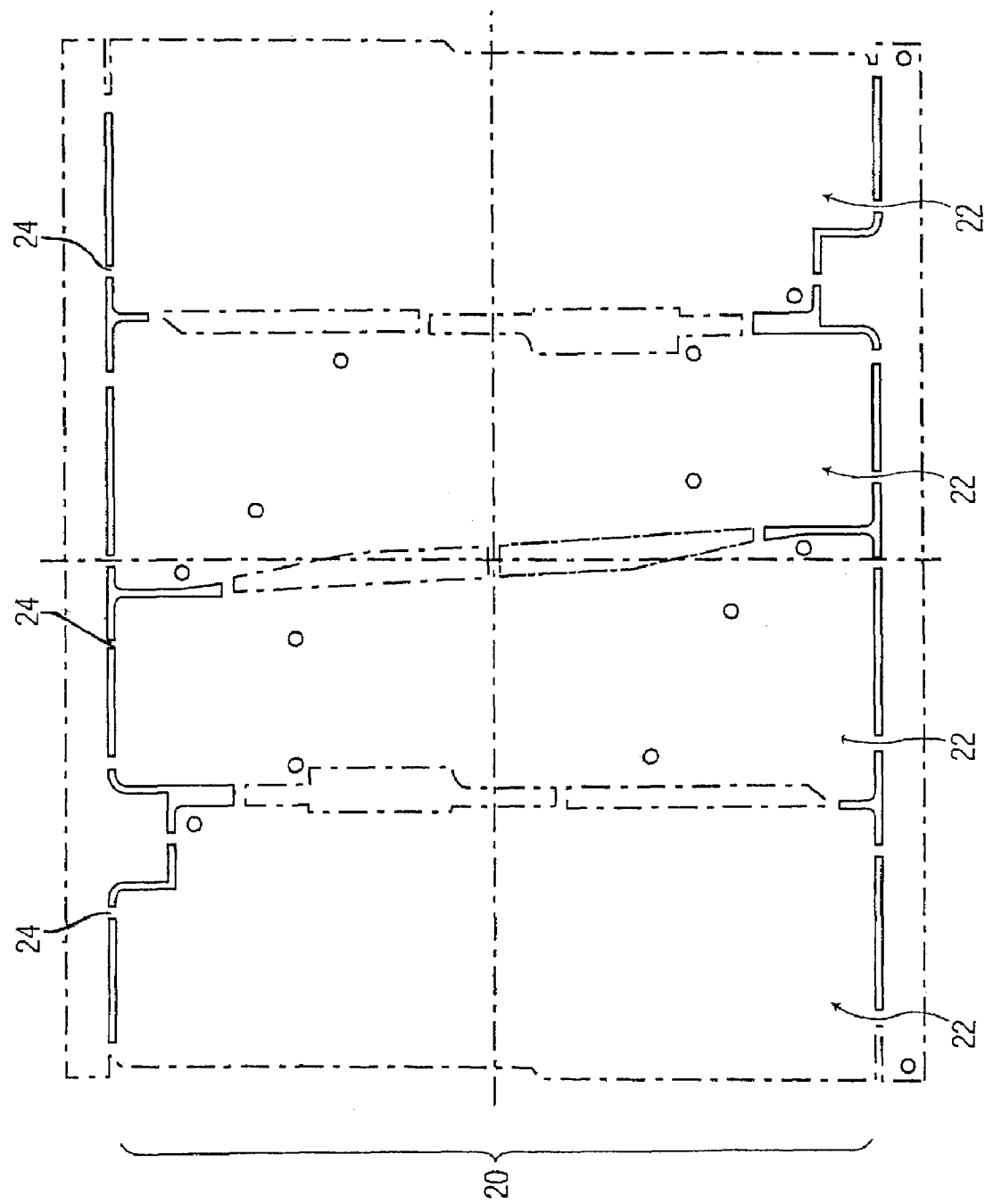
FIG. 6 is a top planar view of a CBA with etched hollowed out space prior to tabs being cleaved.

FIG. 6 shows an overhead view of CBA 20 and tabs 24 to be cleaved. The etchings 26 are located in this illustration throughout the outer perimeter of the CBA 20, and when the tabs 24 are cleaved, four circuit boards 22 are singulated from one another.

Figure 7:
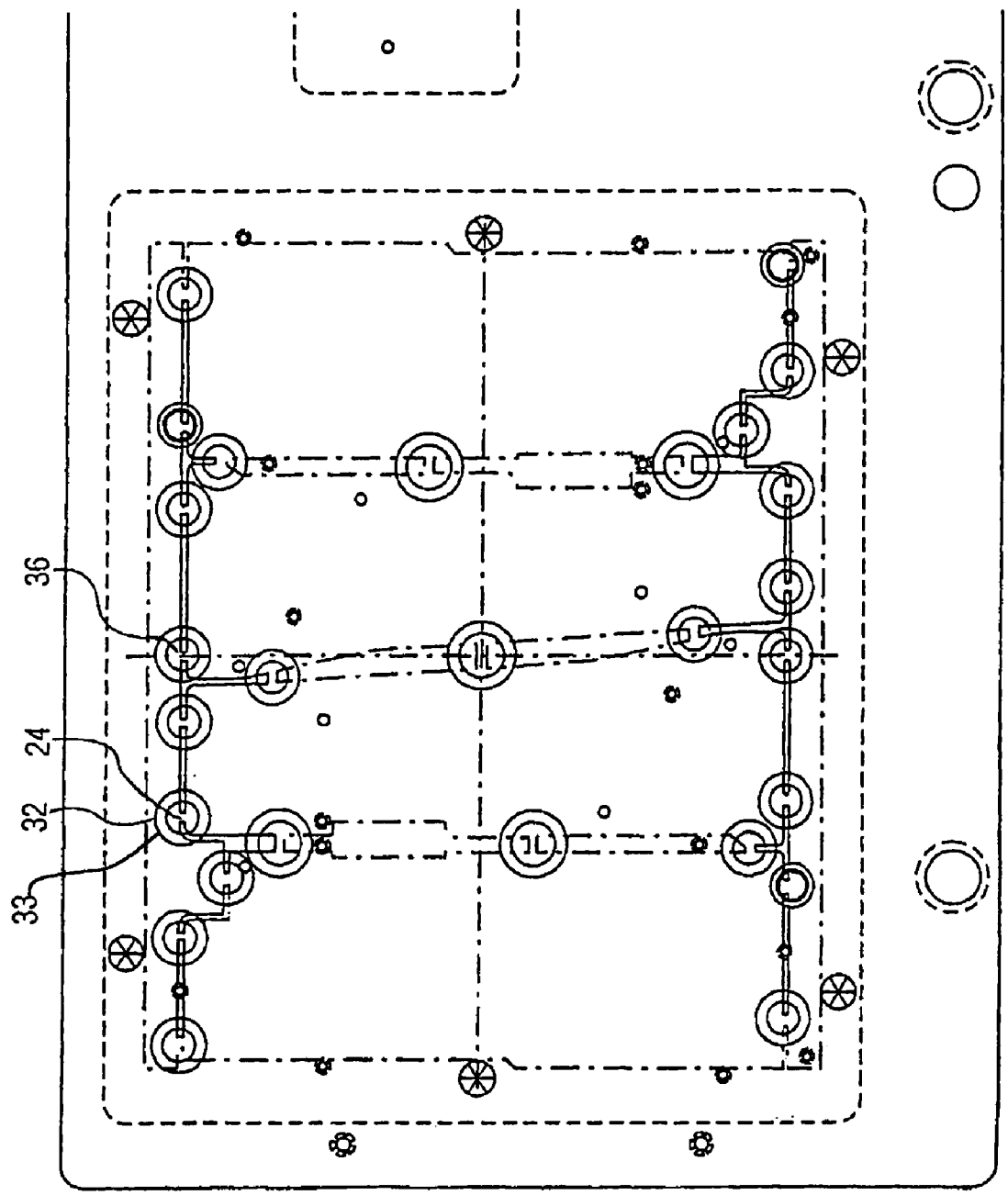
FIG. 7 is a top planar view of the CBA of FIG. 5, illustrating terminating open ends localized at a tab to be routed, and wherein each terminating open end has a circumference or perimeter sufficient to surround each tab.

FIG. 7 is an overhead view illustrating the location of the terminating open ends 33 on a multiplicity of tabs 24. The terminating open ends 33 have a circumference or perimeter 36, which surrounds each of the tabs 24 to be cleaved. Each individual circumference or perimeter 36 of each of the terminating open ends 33 is preferably large enough in size to engulf an individual tab 24. Further, the tabs 24 in this embodiment have varying lengths, and consequently the corresponding terminating open ends 33, preferably have different circumferences or perimeters. The suction from the vacuum system 50 of FIG. 8 is preferably concentrated through one or more of the terminating open ends 33, and more preferably, through each one of the terminating open ends 33 directly to the tabs 24, which are cleaved by the routing machine 70 of FIG. 1. As can be seen in the figures, the length of the individual tabs 24 is substantially the same as the diameter across the circumference 36 of each of the terminating open ends 33 in this embodiment. This allows for an optimal suction velocity to pass through the individual terminating open ends 33, and be directly applied to the area where the routing process is taking place.

Figure 10:
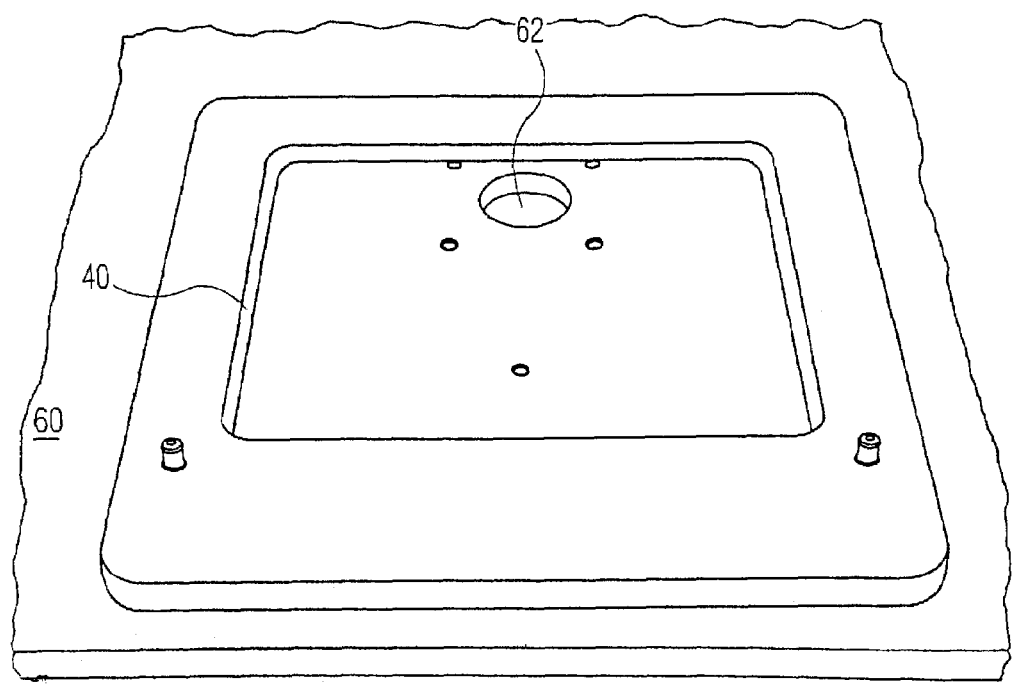

FIG. 8 is a side planar view illustrating a fixture 30, with hollow elements 32 integrated and channeled through terminating open ends 33 of the fixture 30. Each of the multitude of hollow elements 32 preferably pass into the terminating open ends 33 of the fixture 30 and extend through the aperture created by terminating open ends 33, in order to feed into a cavity 62, which is illustrated in FIG. 10. In this embodiment the hollow elements 32 are flush with the bottom of the fixture 30, and connected perpendicular to the connecting surface 31. Tn some cases, however, the hollow elements may be above or below the bottom of the fixture 30. Vacuum system 50 is shown positioned underneath the fixture 30 in FIG. 8, and a vacuum hose 52 extends from the vacuum system and integrates with the fixture 30, as will be described in more detail in FIG. 10. FIG. 8 also illustrates the first open end 33 of the hollow element 32.

Figure 9:
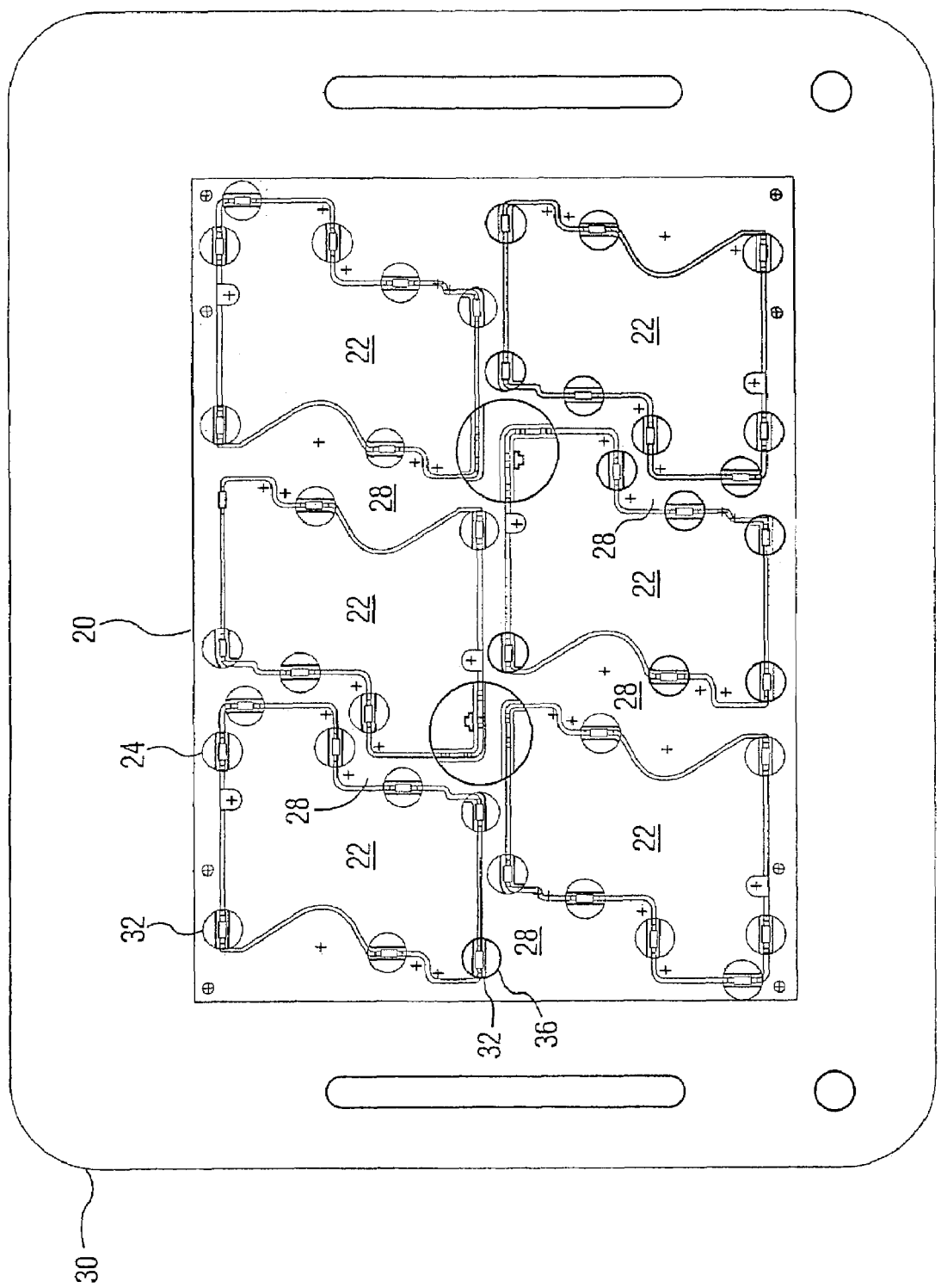
FIG. 9 is a top planar view of six circuit boards in a CBA on a fixture with tabs surrounded by terminating open ends.

FIG. 9 shows another overhead view of CBA 20, having the same CBA 20 as in FIGS. 2 and 3, positioned on fixture 30. The figure shows six separate circuit boards 22, which are singulated by the routing process, and the resulting scrap 28 is preferably disposed. FIG. 9 further illustrates the circumference or perimeter 36 of the hollow elements 32 or terminating open ends 33 in relation to the length of the tabs 24. The diameter or length of the open ends of the hollow elements 32 or terminating open ends 33 are preferably substantially similar to the length of the tabs 24. Each terminating open end 33, or hollow element 32 is still large enough to surround the tabs 24. Further, the first open end 35 of FIG. 8 is large enough to surround the tabs 24.

FIG. 10 shows an exemplary fixture adapter 40 installed on machine top plate 60. The machine top plate 60 has the cavity 62. The cavity 62 has vacuum hose 52 connected on the underside of the machine top plate 60, and applies suction through the cavity 62, and then up through the terminating open ends 33, and then through the hollow elements 32. The vacuum system 50 applies suction to the underside of the fixture 30 when the fixture 30 is installed on fixture adapter 40.

Figure 11:
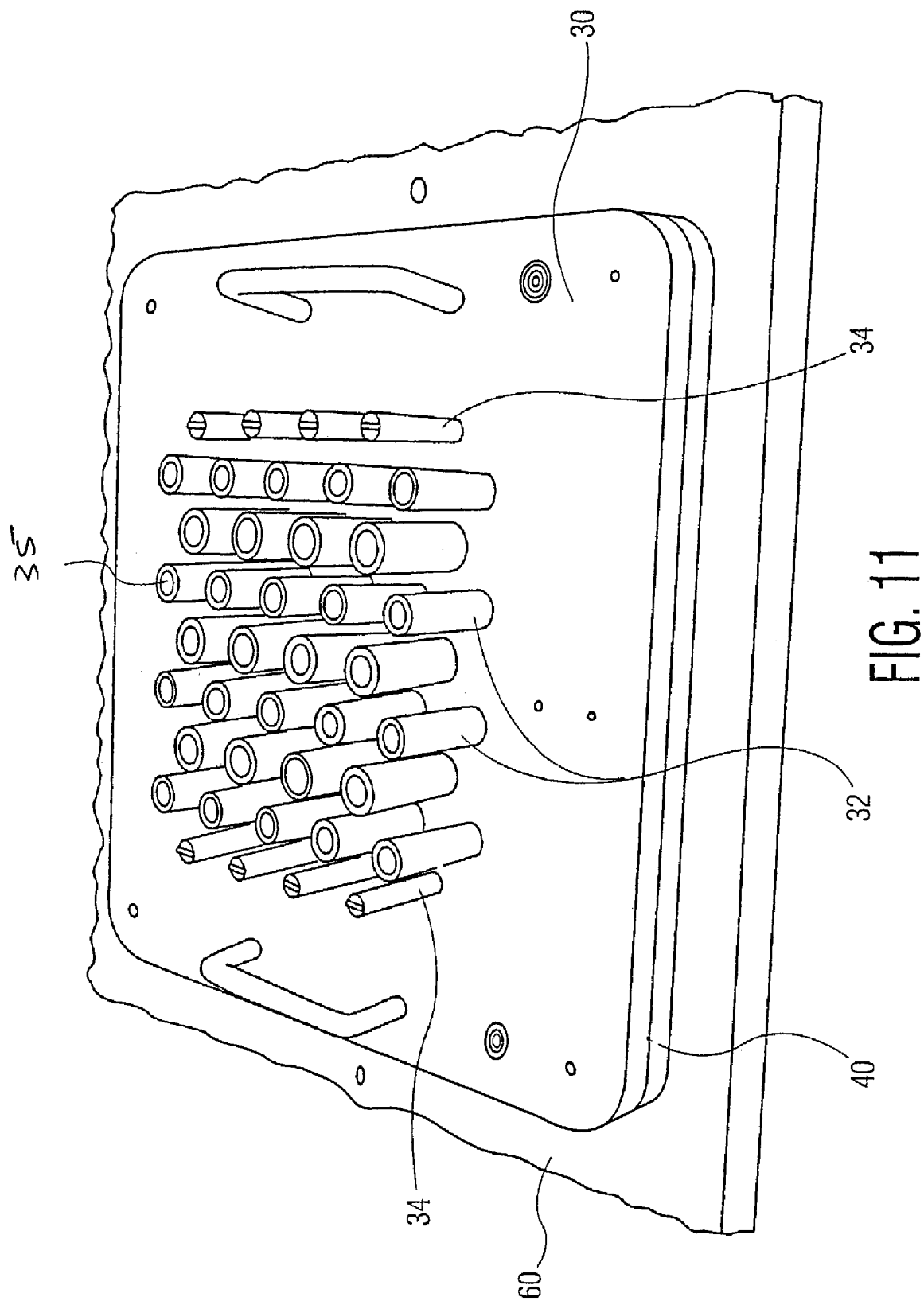
FIG. 11 is a perspective view of an embodiment of a fixture installed on a fixture adapter.

FIG. 11 shows a preferred embodiment of the fixture 30 installed on the top surface of the fixture adapter 40. In this embodiment, thirty-two hollow elements 32, and four standing pins 34 flanking the outside rows of the hollow elements 32 are provided, although as should be understood, other numbers of elements 32 and standing pins 34 can also be provided where desired. The standing pins 34 provide support when a CBA 20 is placed on top of the hollow elements 32. In operation, when the vacuum system 50 is utilized, it applies suction through the terminating open ends 33 and up through hollow elements 32 and down into the cavity 62, as illustrated in FIG. 10. Also, this embodiment shows the first open end 35, of the hollow element 32, through which suction is applied.

The components illustrated in the exemplary embodiments can be comprised of a number of suitable materials. The fixture plate, fixture adapter, and machine top plate can be comprised of, individually or in combination, steel, aluminum, titanium alloy, or any other of a number of materials, which exhibit the aforementioned materials characteristics. In a preferred embodiment tile fixture plate is comprised of aluminum. The hollow elements can be comprised of any of a number of materials including steel, aluminum, and those exhibiting plastic qualities, such as polyethylene, and also material such as TEFLON®, DEL-RLN® or nylon. The CBA described in the exemplary embodiments of this invention is comprised of materials well understood and recognized in the art.

The above description and the views and materials depicted by the figures are for purposes of illustration only and are not intended to be, and should not be construed as, limitations on the invention.

Moreover, certain modifications or alternatives may suggest themselves to those skilled in the art upon reading of this specification, all of which are intended to be within the spirit and scope of the present invention as defined in the attached claims.

What is claimed is:

1. An apparatus for retaining and cleaning a circuit board array during a de-paneling process of circuit boards from the circuit board array, wherein the circuit boards are interconnected by tabs, said apparatus comprising:
a fixture comprising at least one standing feature to retain or locate the circuit board array with respect to the fixture during tile de-paneling process, said fixture further comprising a generally elongated connecting surface and one or more hollow elements connected to and extending generally transverse to the top of the generally elongated connecting surface, said hollow elements having first and second open ends, wherein each said first open end creates an opening substantially aligned with at least one of the tabs of the circuit board army and each said second open end opens to a cavity configured to receive debris from the tab created during the de-paneling process.

2. An apparatus as in claim 1, wherein the circuit board array has a plurality of the tabs arranged in a predetermined pattern, and said fixture has a plurality of said hollow elements arranged in the predetermined pattern such that each of said hollow elements is positioned adjacent a corresponding one of the tabs.

3. An apparatus as in claim 2, wherein each of the tabs have a length, the first open end of each said hollow elements being sized relatively larger than the length of the corresponding tab.

4. An apparatus as in claim 2, wherein each said hollow elements has a perimeter sufficient to surround the corresponding tab.

5. An apparatus as in claim 2, wherein each said hollow elements has a cylindrical cross-section having a diameter sufficient to surround the corresponding tab.

6. An apparatus as in claim 5, wherein the circumference of each said hollow elements has a diameter slightly larger then a length of the tab.

7. An apparatus as in claim 1, wherein the first open end of each said hollow elements is substantially planar with respect to one another.

8. An apparatus as in claim 1, wherein each said hollow elements has a cylindrical cross-section having equal diameters.

9. An apparatus as in claim 1, wherein each said hollow elements is configured to engage the circuit board array such that the circuit board array is substantially perpendicular to each first open end of said hollow elements.

10. An apparatus as in claim 1, wherein the circuit board array has a topside and an underside, each said hollow elements is configured to engage the topside of the circuit board array at the tab locations.

11. An apparatus as in claim 1, further comprising a vacuum system coupled to the fixture and communicating with the cavity, the vacuum system being configured to apply suction through the cavity and each said hollow elements.

12. An apparatus as in claim 11, wherein the vacuum system directs a suction pressure to a surface area covered by the surface area of each said hollow elements.

13. An apparatus as in claim 12, wherein the vacuum system applies the suction at a pressure lower then 1 atmosphere to the surface area of each said hollow elements.

14. An apparatus as in claim 1, further comprising a routing device adjacent the fixture, the routing device configured to engage the tabs during the de-paneling process.

15. An apparatus as in claim 1, wherein a support end of each of the standing features is configured to support the circuit board array, the support end is elevated from said connecting surface such that a gap is created between the circuit board array and said connecting surface, each said hollow elements substantially filling said gap.

16. An apparatus as in claim 1, wherein said standing feature comprises a rib extending from a distal end of the standing feature, the circuit board array configured to abut said rib for positioning the circuit board array with respect to the fixture during the de-paneling process.

17. An apparatus as in claim 1, wherein the hollow elements are arranged in a non-orthogonal arrangement.

18. An apparatus as in claim 1, wherein the hollow elements are oriented in predetermined positions to localize the first ends at respective tab locations to remove tab debris created during the de-paneling process.

19. An apparatus as in claim 1, wherein the hollow elements comprise a first set of hollow elements having a first diameter and a second set of hollow elements having a different, second diameter.

20. An apparatus as in claim 1, wherein said hollow elements extend from the top of the connecting surface.

21. An apparatus as in claim 1, wherein said first open end of each said hollow element is coplanar with the top of the connecting surface.

22. An apparatus as in claim 1, wherein a locating portion of said standing features are configured to extend through corresponding locating openings within the circuit board array to locate the circuit board array with respect to the fixture.

23. An apparatus for retaining and cleaning a circuit board array during a de-paneling process of circuit boards from the circuit board array, wherein the circuit boards are interconnected by tabs, said apparatus comprising:
a circuit board array having multiple circuit hoards interconnected by tabs; and
a fixture comprising a generally elongated supporting surface for supporting the circuit board array during the de-paneling process, said fixture further comprising a plurality of apertures extending from the supporting surface, each of the apertures being substantially aligned with at least one of the tabs of the circuit board array, each of the apertures open to a cavity configured to receive debris from the tab created during the de-paneling process.

24. An apparatus as in claim 23, wherein the circuit board array has a plurality of the tabs arranged in a predetermined pattern and the apertures are arranged in the predetermined pattern such that each of the apertures are positioned adjacent a corresponding one of the tabs.

25. An apparatus as in claim 24, wherein each of the tabs have a length, the apertures being sized relatively larger than the length of the corresponding tab.

26. An apparatus as in claim 23, wherein the circuit board array has a topside and an underside, the supporting surface being configured to engage the topside of the circuit board array such that the apertures are aligned at the tab locations.

27. An apparatus as in claim 23, further comprising a vacuum system coupled to the fixture and communicating with the cavity, the vacuum system being configured to apply suction through the cavity and the apertures.

28. An apparatus as in claim 27, wherein the vacuum system is configured to direct a suction pressure to the portion of the circuit hoard array adjacent each of the apertures.

29. An apparatus as in claim 28, future comprising hollow elements extending outward from the supporting surface, the apertures extending through the hollow elements and defining hollow portions of the hollow elements, a distal end of each hollow element configured to support the circuit board array at respective tab locations.

30. An apparatus as in claim 23, Further comprising a routing device adjacent the fixture, the routing device configured to engage the tabs during the de-paneling process.

* * * * *